(12) United States Patent
Fujii et al.

(10) Patent No.: US 7,371,506 B2
(45) Date of Patent: May 13, 2008

(54) POSITIVE PHOTOSENSITIVE RESIN COMPOSITION

(75) Inventors: Hirofumi Fujii, Ibaraki (JP); Makoto Saito, Ibaraki (JP); Kenji Ohnishi, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 86 days.

(21) Appl. No.: 11/367,582

(22) Filed: Mar. 6, 2006

(65) Prior Publication Data

US 2006/0199102 A1 Sep. 7, 2006

(30) Foreign Application Priority Data

Mar. 7, 2005 (JP) ............................. 2005-062889
Oct. 20, 2005 (JP) ............................. 2005-306078

(51) Int. Cl.
*G03F 7/00* (2006.01)
*G03F 7/004* (2006.01)

(52) U.S. Cl. .................. 430/270.1; 430/281.1; 430/286.1; 430/913

(58) Field of Classification Search ............. 430/270.1, 430/913, 281.1, 286.1
See application file for complete search history.

(56) References Cited

U.S. PATENT DOCUMENTS

| 5,122,436 | A | * | 6/1992 | Tunney et al. ............ 430/288.1 |
| 5,449,584 | A | | 9/1995 | Banba et al. |
| 5,858,518 | A | * | 1/1999 | Omote et al. ................ 428/209 |
| 6,096,482 | A | * | 8/2000 | Omote et al. ................ 430/311 |
| 6,300,037 | B1 | | 10/2001 | Fujii et al. |

FOREIGN PATENT DOCUMENTS

| EP | 0 502 400 A1 | 9/1992 |
| JP | 5-5995 A | 1/1993 |
| JP | 5-113668 A | 5/1993 |
| JP | 5-281717 A | 10/1993 |
| JP | 2000290501 A * | 10/2000 |
| JP | 2001022063 A * | 1/2001 |

OTHER PUBLICATIONS

English language machine translation of JP 2001-022063.*

* cited by examiner

*Primary Examiner*—Amanda Walke
(74) *Attorney, Agent, or Firm*—Birch, Stewart, Kolasch & Birch, LLP

(57) ABSTRACT

A positive photosensitive resin composition comprising (A) a polyamic acid, (B) a 1,4-dihydropyridine derivative represented by the general formula (II):

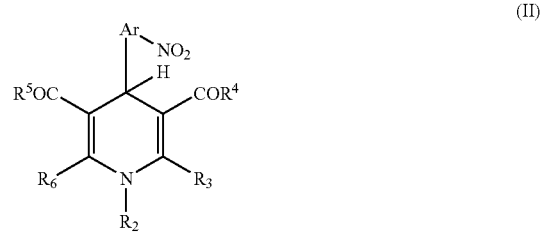

(II)

wherein $R^2$ is a monovalent organic group; each of $R^3$, $R^4$, $R^5$, and $R^6$ is independently hydrogen or a monovalent organic group; and $Ar-NO_2$ is an aromatic hydrocarbon group having a nitro group at ortho-position, and (C) an amine compound.

4 Claims, No Drawings

# POSITIVE PHOTOSENSITIVE RESIN COMPOSITION

FIELD OF THE INVENTION

The present invention relates to a positive photosensitive resin composition.

BACKGROUND OF THE INVENTION

Generally, positive photosensitive materials are said to be positively tapered and to have high resolution. As these photosensitive materials, a photoresist obtained from diazonaphthoquinone and novolak resin, and a chemically amplified material using a photoacid generator have been actually used. However, the above photoresist is poor in mechanical strength and electrical characteristics when used as a structural material such as cover insulation material and interlayer dielectric material. Also, as to the chemically amplified material, a photoacid generator is used, thereby making it difficult to use the material in applications requiring electrical reliability.

In order to overcome these disadvantages, the present inventors have previously proposed a positive photosensitive material comprising a 1,4-dihydropyridine derivative and a polyimide precursor resin, and a process for preparing the same (see, for example, Japanese Patent Laid-Open Nos. Hei 05-005995 and Hei 05-281717).

However, in the positive photosensitive material described above, image contrast was low during formation the fixed image at a film thickness of 5 μm or more, and it has been difficult to provide a material having low elasticity.

Accordingly, in view of overcoming these disadvantages, an object of the present invention is to provide a positive photosensitive resin composition having low elasticity, high heat resistance, and high resolution.

These and other objects of the present invention will be apparent from the following description.

SUMMARY OF THE INVENTION

Specifically, the present invention relates to a positive photosensitive resin composition comprising:
(A) a polyamic acid,
(B) a 1,4-dihydropyridine derivative represented by the general formula (II):

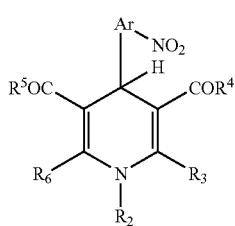

(II)

wherein $R^2$ is a monovalent organic group; each of $R^3$, $R^4$, $R^5$, and $R^6$ is independently hydrogen or a monovalent organic group; and Ar—$NO_2$ is an aromatic hydrocarbon group having a nitro group at ortho-position, and
(C) an amine compound.

According to the present invention, a positive photosensitive resin composition having low elasticity, high heat resistance, and high resolution (hereinafter simply referred to as composition in some cases) can be provided.

DETAILED DESCRIPTION OF THE INVENTION

The features of the positive photosensitive resin composition of the present invention resides in that the composition comprises:
(A) a polyamic acid,
(B) a 1,4-dihydropyridine derivative represented by the general formula (II):

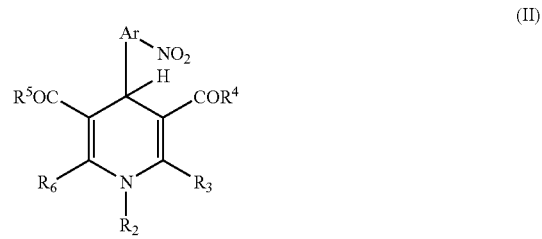

(II)

wherein $R^2$ is a monovalent organic group; each of $R^3$, $R^4$, $R^5$, and $R^6$ is independently hydrogen or a monovalent organic group; and Ar—$NO_2$ is an aromatic hydrocarbon group having a nitro group at ortho-position, and
(C) an amine compound.

Since the positive photosensitive resin composition of the present invention has the above feature, there is exhibited an effect that the composition has low elasticity, high heat resistance, and high resolution. More specifically, the positive photosensitive resin composition of the present invention has a property that a cured product thereof has a storage modulus of 1 GPa or less at 25° C., and 1 MPa or more at 250° C. Therefore, the positive photosensitive resin composition of the present invention can provide a positive photosensitive pattern, and can be utilized in the manufacture of high-density devices which require high reliability.

The polyamic acid of the component (A) can be obtained, for example, by reacting a tetracarboxylic dianhydride with a diamine in an organic solvent substantially at an equal molar ratio.

As the polyamic acid of the component (A), preferable is a polyamic acid having in its backbone a structural unit represented by the general formula (I):

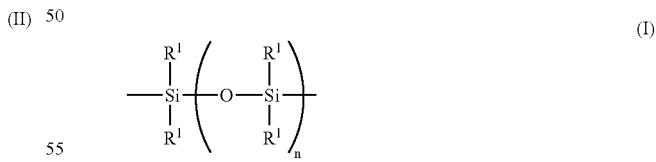

(I)

wherein $R^1$ is a methyl group or other organic group. The other organic group includes, for example, an alkyl group other than a methyl group, a benzyl group, an aromatic group such as a phenyl group, a fluorine-containing alkyl group, a halogenated alkyl group, a polyalkylene oxide group, and the like. $R^1$ is preferably a methyl group and a phenyl group, and more preferably a methyl group. n is an average degree of polymerization and is 2 or more and 50 or less, preferably 2 or more and 25 or less, and more preferably 2 or more and 12 or less. The polyamic acid can be obtained by reacting a tetracarboxylic dianhydride with a diamine having a structural unit represented by the general formula (I):

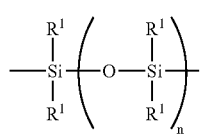

wherein $R^1$ is a methyl group or other organic group; and n is an average degree of polymerization, and is 2 or more and 50 or less, and preferably 2 or more and 12 or less, in an organic solvent substantially in an equimolar ratio.

The tetracarboxylic dianhydride includes, for example, 3,3',4,4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 4,4'-hydroxydiphthalic dianhydride, 2,2-bis(2,3-dicarboxyphenyl)hexafluoropropane dianhydride, 2,2-bis(3,4-dicarboxyphenyl)hexafluoropropane dianhydride (6FDA), bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, pyromellitic dianhydride, ethylene glycol bistrimellitic dianhydride, and the like. These may be used alone or in combination of two or more kinds.

As the diamine, there is used a diamino-terminated silicone oligomer represented by the general formula (III):

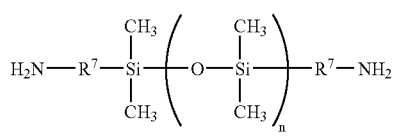

wherein $R^7$ is an alkylene group; and n is an average degree of polymerization, and is 2 or more and 50 or less, preferably 2 or more and 25 or less, and more preferably 2 or more and 12 or less. In the case where n is less than 2, it is difficult to lower the elasticity of the cured product of the composition of the present invention. In the case where n is more than 50, a sea-island structure made of silicone domains is formed, thereby making it difficult to obtain high resolution for the composition of the present invention. As the diamino-terminated silicone oligomer, for example, a commercially available silicone diamine (for example, TSL9346 commercially available from GE Toshiba Silicones, BY16-853C commercially available from Dow Corning Toray Co., Ltd., or the like) can be used.

The amount of the silicone group introduced into the composition of the present invention by the above-mentioned diamino-terminated silicone oligomer is preferably from 10 to 90% by weight, and more preferably from 30 to 60% by weight, of the entire composition. When the amount of the silicone group is 10% by weight or more, the elasticity can easily be lowered, whereby excellent positive fixed images are obtained. In the case where the amount is 90% by weight or less, an excellent developability is obtained.

As the diamine, besides the above-mentioned diamino-terminated silicone oligomer, 4,4'-diaminodiphenyl ether, 3,4'-diaminodiphenyl ether, 3,3'-diaminodiphenyl ether, m-phenylenediamine, p-phenylenediamine, 4,4'-diaminodiphenylpropane, 3,3'-diaminodiphenylpropane, 4,4'-diaminodiphenylmethane, 3,3'-diaminodiphenylmethane, 4,4'-diaminodiphenylsulfide, 3,3'-diaminodiphenylsulfide, 4,4'-diaminodiphenylsulfone, 3,3'-diaminodiphenylsulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, hexamethylenediamine, 1,8-diaminooctane, 1,12-diaminododecane, 4,4'-diaminobenzophenone, α,ω-bisaminopropyltetramethyl disiloxane, or the like can also be used. These may be used alone or in combination of two or more kinds.

The solvent includes, for example, N,N-dimethylacetamide, N-methyl-2-pyrrolidone, N,N-dimethylformamide, and the like. In order to control solubility of the raw materials, in addition to the above-mentioned solvent, a nonpolar solvent such as toluene or xylene can further be used.

The above-mentioned polyamic acid can be obtained by adding preferably 5 to 100 parts by weight of a tetracarboxylic dianhydride and 2 to 50 parts by weight of a diamine, based on 100 parts by weight of a solvent mentioned above, and reacting the mixture. More specifically, the polyamic acid can be prepared by dissolving a diamine in a solvent, adding a tetracarboxylic dianhydride thereto, and reacting the mixture.

The molar ratio of the tetracarboxylic dianhydride to the diamine (tetracarboxylic dianhydride/diamine) is preferably from 4/5 to 5/4, and more preferably from 19/20 to 20/19.

The reaction temperature and time are not limited to specified ones, as long as the desired polyamic acid is obtained. For example, the reaction temperature is usually from 0° to 120° C., and preferably from 20° to 90° C., and the reaction time is usually from 30 minutes to 100 hours, and preferably from 3 to 72 hours.

The polyamic acid is obtained usually in the form of solution after the termination of the reaction. The polyamic acid can also be isolated by adding the solvent dropwise into a hardly soluble solvent such as methanol or water to form a precipitate, collecting the precipitate by filtration, and drying the residue.

The content of the polyamic acid in the composition of the present invention, in other words, a total amount of the tetracarboxylic dianhydride and the diamine, is preferably from 30 to 90% by weight, and more preferably from 60 to 85% by weight, of the composition.

The 1,4-dihydropyridine derivative of the component (B) functions as a photosensitizing agent in the positive photosensitive resin composition, and is represented by the general formula (II):

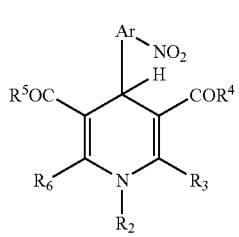

wherein $R^2$ is a monovalent organic group; each of $R^3$, $R^4$, $R^5$, and $R^6$ is independently hydrogen or a monovalent organic group; and Ar—$NO_2$ is an aromatic hydrocarbon group having a nitro group at ortho-position. The monovalent organic group includes, for example, a methyl group, an ethyl group, an n-propyl group, an iso-propyl group, an n-butyl group, a tert-butyl group, an iso-butyl group, a benzyl group, a phenyl group, and derivatives thereof, and the like.

Specific examples of the 1,4-dihydropyridine derivative include 1-ethyl-3,5-dimethoxycarbonyl-4-(2-nitrophenyl)-1,4-dihydropyridine, 1-ethyl-3,5-dimethoxycarbonyl-4-(2,4-dinitrophenyl)-1,4-dihydropyridine, 1,2,6-trimethyl-3,5-dimethoxycarbonyl-4-(2-nitrophenyl)-1,4-dihydropyridine, 2,6-dimethyl-3,5-diacetyl-4-(2-nitrophenyl)-1,4-dihydropyridine, 1-carboxyethyl-3,5-dimethoxycarbonyl-4-(2-nitrophenyl)-1,4-dihydropyridine, 1-[2-(dimethylamino)ethyl]-3,5-dimethoxycarbonyl-4-(2-nitrophenyl)-1,4-dihydropyridine, and the like. Among them, 1-ethyl-3,5-dimethoxycarbonyl-4-(2-nitrophenyl)-1,4-dihydropyridine or 1,2,6-trimethyl-3,5-dimethoxycarbonyl-4-(2-nitrophenyl)-1,4-dihydropyridine is preferable. These 1,4-dihydropyridine derivatives may be used alone or in combination of two or more kinds.

The content of the 1,4-dihydropyridine derivative in the composition of the present invention is preferably from 5 to 30 parts by weight, and more preferably from 10 to 20 parts by weight, based on 100 parts by weight of a total amount of the tetracarboxylic dianhydride and the diamine. When the content of the 1,4-dihydropyridine derivative is 5 parts by weight or more, the contrast is less likely to be lowered during pattern formation. When the content is 30 parts by weight or less, a composition having excellent physical properties can be prepared.

The amine compound of the component (C) may be any one of a primary amine compound, a secondary amine compound, and a tertiary amine compound. These may be used alone or in combination of two or more kinds.

The primary amine compound includes, besides the amine used as a raw material for the above-mentioned polyamic acid, ethanolamine, 3-aminobenzoic acid, 4-aminobenzoic acid, 1-aminoanthracene, 1-aminoanthraquinone, and the like.

The secondary amine compound includes diethanolamine, N-methylaniline, diphenylamine, N,N-dimethylethylenediamine, 1-(methylamino)anthraquinone, 9-(methylaminoethyl)anthracene, and the like.

The tertiary amine compound includes aliphatic tertiary amine compounds, nitrogen-containing heterocyclic compounds, and the like.

The aliphatic tertiary amine compound includes, for example, high boiling tertiary amines such as tribenzylamine, and the like.

The nitrogen-containing heterocyclic compound includes, for example, compounds having an unshared electron pair on the nitrogen, such as imidazoles, benzoimidazoles, purines, pyridines, pyridazines, pyrimidines, pyrazines, triazines, quinolines, isoquinolines, and acridines. Specific examples thereof include imidazoles such as imidazole, N-methylimidazole, 2-methylimidazole, 2-ethyl-4-methylimidazole, 2-phenylimidazole, 1-benzyl-2-methylimidazole, 2-phenyl-4-methylimidazole, 1-aminoethyl-2-methylimidazole, and 2-phenyl-4-methyl-5-hydroxymethylimidazole; pyridines such as pyridine, methylpyridine, dimethylpyridine, propylpyridine, and 4-dimethylaminopyridine; and the like.

The content of the amine compound in the composition of the present invention is preferably from 0.5 to 30 parts by weight, and more preferably from 1 to 15 parts by weight, based on 100 parts by weight of a total amount of the tetracarboxylic dianhydride and the diamine. When the content of the amine compound is 0.5 parts by weight or more, the contrast is less likely to be lowered during pattern formation. When the content is 30 parts by weight or less, a composition having excellent physical properties can be prepared.

The composition of the present invention can be prepared by mixing the components (A), (B), and (C). Specifically, the composition can be prepared by adding a 1,4-dihydropyridine derivative and an amine compound to a polyamic acid solution prepared by reacting a tetracarboxylic dianhydride with a diamine in an organic solvent, and dissolving the components in the solution.

The positive photosensitive resin composition of the present invention thus obtained has a property that a cured product thereof has a storage modulus of 1 GPa or less at 25° C., and 1 MPa or more at 250° C. In addition, the positive photosensitive resin composition of the present invention has excellent properties of low elasticity, high heat resistance, and high resolution.

As the component (A), in the case of using a polyamic acid obtained by using a diamine having an alkylene group directly bonded to an aromatic ring, represented by the general formula (IV):

$$H_2N-R-Ar-R-NH_2 \quad (IV)$$

wherein R is an alkylene group having 1 to 3 carbon atoms; and Ar is an aryl group, together with the diamino-terminated silicone oligomer, and reacting the mixture with 4,4'-hydroxydiphthalic anhydride (ODPA) or 3,3'4,4'-biphenyltetracarboxylic dianhydride (BPDA), in addition to low elasticity, high heat resistance, and high resolution, the transmittance in i-line (wavelength: 365 nm) is improved, whereby patterning by i-line exposure can be carried out. The "storage modulus of the cured product" used herein refers to a storage modulus of a 15 μm-thick film (cured product) obtained by dissolving a composition of the present invention in a solvent, applying the solution to a SUS304 foil having a thickness of 25 μm and a size of 100 mm×100 mm with a spin coater, drying a coated foil in an oven at 100° C. for 10 minutes, and treating the dried foil at 300° C. for 2 hours under a nitrogen atmosphere.

The storage modulus can be determined in accordance with the method described in Examples below.

The composition of the present invention forms a pattern, for example, in the following manner. Specifically, a resin solution prepared by dissolving the above-mentioned composition in an organic solvent is applied to a proper object to be coated; the applied coating is dried to form a film; and the film is exposed through a photomask; subsequently, the exposed film is heat-treated and then subjected to development; finally, the developed film is heat-treated at a high temperature, whereby a resin layer having a positive pattern shape can be obtained.

The above-mentioned organic solvent includes, for example, N-methyl-2-pyrrolidone, N,N-dimethylacetamide, N,N-dimethylformamide, and the like.

The object to be coated includes, for example, substrates such as a silicon wafer, and the like.

Processes for applying a resin solution to the object to be coated include a process comprising directly applying a resin solution to an object to be coated by using a spin coating method, spraying method, or the like; a process comprising coating a resin solution on a PET (polyethylene terephthalate) film or a polyimide film using a comma coating method, a fountain method, a gravure method, or the like, transferring the coating on the object to be coated, and laminating the transferred coating; and the like.

In the exposure, active rays such as ultraviolet rays, electron rays, and microwaves can be used. After the exposure, the temperature for the heat treatment before the development is usually from 120° to 180° C., and the time period is usually from 30 seconds to 30 minutes.

It is preferable that an aqueous alkaline solution is used as a developer. In order to control the development time, an alcohol or a surfactant may be added to the developer.

The final heat treatment temperature is usually from 200° to 400° C. In order to prevent oxidation degradation of the resin layer, it is desirable to carry out the heat treatment under a nitrogen atmosphere or under an inert atmosphere such as in a vacuum.

As described above, a patterned resin layer having low elasticity, high heat resistance, and high resolution can be formed on an object to be coated.

EXAMPLES

The present invention will be described further hereinbelow by means of Examples, without intending to limit the present invention thereto.

The evaluation methods in Examples are summarized below.

1. Storage Modulus

The storage modulus was determined with a viscoelastometer RSA-II (commercially available from Rheometric Scientific F. E. Ltd.) under the conditions of tensile mode, a frequency of 1 Hz, and a strain of 0.3%.

2. Resolution

Exposure was carried out with a resolution test chart, and a smallest via hole size that was opened during exposure was defined as resolution.

3. Residual Film Ratio (1) Residual Film Ratio During Development

A film thickness before development and that after the development were determined, and the residual film ratio during the development was calculated using the following formula:

Residual film ratio during development (%)=(Film thickness after development)/(Film thickness before development)×100

(2) Residual Film Ratio During Curing

A film thickness after curing and that after development were determined, and the residual film ratio during the curing was calculated using the following formula:

Residual film ratio during curing (%)=(Film thickness after curing)/(Film thickness before development)×100

Example 1

The amount 37.5 g of silicone diamine (commercially available from GE Toshiba Silicones, TSL9346) represented by the formula (V):

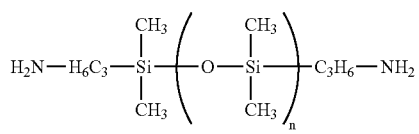

(V)

wherein n is 5, and 13.8 g of 4,4'-diaminodiphenyl ether (hereinafter simply referred to as DDE) were dissolved in 240 g of N,N-dimethylacetamide (hereinafter simply referred to as DMAc). Next, 30.0 g of pyromellitic dianhydride (hereinafter simply referred to as PMDA) was further added thereto, and the components were reacted at room temperature for 24 hours.

Next, 12.2 g of 1-ethyl-3,5-dimethoxycarbonyl-4-(2-nitrophenyl)-1,4-dihydropyridine and 1.6 g of imidazole were further added to the reacted mixture and dissolved, to give a resin solution of a positive photosensitive resin composition of the present invention.

This resin solution was applied to a silicon wafer with a spin coater, and the applied coating was dried on a hot plate at 100° C. for 3 minutes, to give a film having a thickness of 14 μm. The film was exposed with a 500 W ultra-high pressure mercury lamp through a photomask having a resolution test pattern for 3 minutes, and the exposed film was heated on a hot plate at 150° C. for 5 minutes. Thereafter, the film thickness (film thickness before development) was determined. Subsequently, using a developer containing a 10% aqueous solution of tetramethylammonium hydroxide (hereinafter simply referred to as TMAH)/ethanol=1/1, development was carried out (for about 30 seconds to about 1 minute) until the exposed portion of the film was dissolved and removed. After rinsing of the developed film with water, the film thickness (film thickness after the development) and the resolution of the film were determined. Further, the film was heat-treated in a stainless steel heating furnace at 300° C. for 1 hour under a nitrogen atmosphere to cure the film, and the cured film thickness (film thickness after the curing) was determined. From these results, the residual film ratio during the development and the residual film ratio during the curing were calculated. The results are shown in Table 1.

Next, the resin solution described above was applied to a 25 μm-thick SUS304 foil having a size of 100 mm×100 mm with a spin coater, and the coated foil was dried in an oven at 100° C. for 10 minutes. Thereafter, the dried foil was heat-treated in the stainless steel heating furnace at 300° C. for 2 hours under a nitrogen atmosphere, to prepare a film (cured product) having a thickness of 15 μm on the SUS304 foil. The SUS304 foil was removed by etching with a ferric chloride solution, and thereafter the storage modulus of the cured product was determined at 25° C. and at 250° C., respectively, in accordance with the method mentioned above. The results are shown in Table 1.

Example 2

The amount 52.0 g of silicone diamine (commercially available from Dow Corning Toray Co., Ltd., BY16-853C) represented by the formula (VI):

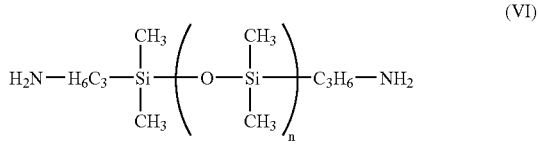

(VI)

wherein n is 8, and 17.7 g of DDE were added to 195 g of N-methyl-2-pyrrolidone (NMP), and the mixture was stirred until DDE was dissolved. Next, 35.0 g of PMDA was added thereto, and the components were reacted for 1 hour. Further, the reaction mixture was heated to 70° C., and stirred for 5 hours, to give a transparent solution. After cooling the solution, 15.7 g of 1-ethyl-3,5-diethoxycarbonyl-4-(2-nitrophenyl)-1,4-dihydropyridine and 2.1 g of imidazole were added thereto and dissolved, to give a positive photosensitive resin composition of the present invention.

This resin solution was applied to a silicon wafer with a spin coater, and the coated solution was dried on a hot plate at 100° C. for 5 minutes, to give a film having a thickness of 14 μm. The film was exposed with a 500 W ultra-high pressure mercury lamp through a photomask having a resolution test pattern for 3 minutes, and the exposed film was heated on a hot plate at 150° C. for 5 minutes. Thereafter, the film thickness (film thickness before development) was determined. Subsequently, using a developer containing a 10% aqueous TMAH solution/ethanol=1/1, development was carried out until the exposed portion of the film was dissolved and removed. After rinsing of the developed film with water, the film thickness (film thickness before the development) and the resolution of the film were determined. Further, the film was heat-treated in a stainless steel heating furnace at 330° C. for 1 hour under a nitrogen atmosphere to cure the film, and the cured film thickness (film thickness after the curing) was determined. From these results, the residual film ratio during the development and the residual film ratio during the curing were calculated. The results are shown in Table 1.

Next, the resin solution described above was applied to a SUS foil having a thickness of 25 μm and a size of 100 mm×100 mm with a spin coater, and the applied foil was dried in an oven at 100° C. for 10 minutes. Thereafter, the dried foil was heat-treated in the stainless steel heating furnace at 330° C. for 1 hour under a nitrogen atmosphere, to prepare a film having a thickness of 15 μm on the SUS304 foil. The SUS304 foil was removed by etching with ferric chloride, and thereafter the storage modulus of the cured product was determined at 25° C. and at 250° C., respectively, in accordance with the method mentioned above. The results are shown in Table 1.

Example 3

The same procedures as in Example 2 were carried out except that 3.1 g of 4-dimethylaminopyridine was used in place of imidazole, to give a resin solution of a positive photosensitive resin composition of the present invention. As for the resulting resin solution, the same procedures as in Example 1 were carried out to determine and the residual film ratio during the development, the residual film ratio during the curing, the resolution, and the storage modulus.

Example 4

The amount 26.4 g of silicone diamine (commercially available from GE Toshiba Silicones, TSL9346) represented by the formula (V):

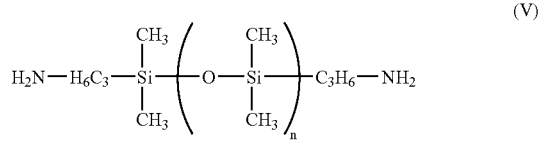

wherein n is 5, and 5.2 g of p-phenylenediamine were dissolved in 250 g of DMAc. Next, 30.0 g of 4,4'-hydroxydiphthalic dianhydride was further added thereto, and the resulting mixture was reacted at room temperature for 24 hours.

Next, 9.2 g of 1-ethyl-3,5-dimethoxycarbonyl-4-(2-nitrophenyl)-1,4-dihydropyridine and 1.2 g of imidazole were further added to the reaction mixture and dissolved, to give a resin solution of a positive photosensitive resin composition of the present invention.

As for the resulting resin solution, the same procedures as in Example 1 were carried out to determine and the residual film ratio during the development, the residual film ratio during the curing, the resolution, and the storage modulus. The results are shown in Table 1.

Example 5

The same procedures as in Example 1 were carried out except that 2.8 g of 4-diaminodiphenyl ether was used in place of imidazole, to give a resin solution of a positive photosensitive resin composition of the present invention. As for the resulting resin solution, the same procedures as in Example 1 were carried out to determine and the residual film ratio during the development, the residual film ratio during the curing, the resolution, and the storage modulus. The results are shown in Table 1.

Example 6

The amount 53.9 g of silicone diamine (commercially available from Shin-Etsu Silicones, X-22-161A) represented by the formula (VII):

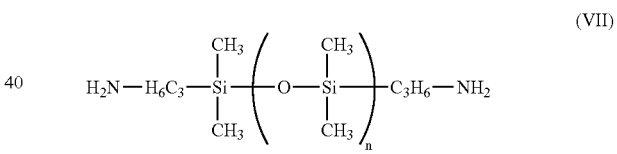

wherein n is 20, and 13.4 g of m-xylylenediamine were added to 261 g of NMP. Next, 41.0 g of 4,4'-hydroxydiphthalic anhydride was added thereto, and the resulting mixture was reacted at room temperature for 1 hour. Further, the reaction mixture was heated to 70° C., and stirred for 1 hour, to give a transparent solution. After cooling the solution, 16.2 g of 1-ethyl-3,5-diethoxycarbonyl-4-(2-nitrophenyl)-1,4-dihydropyridine and 3.2 g of imidazole were added thereto and dissolved, to give a positive photosensitive resin composition of the present invention.

As for the resulting resin solution, the same procedures as in Example 2 were carried out to determine and the residual film ratio during the development, the residual film ratio during the curing, the resolution, and the storage modulus. The results are shown in Table 1.

Example 7

The amount 53.6 g of silicone diamine (commercially available from GE Dow Corning Toray Co., Ltd., BY16-853U) represented by the formula (VIII):

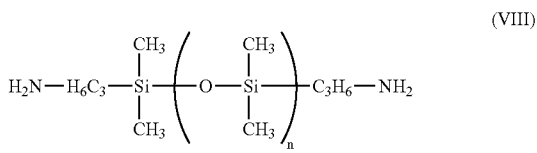

(VIII)

wherein n is 10, and 10.9 g of p-xylylenediamine were added to 200 g of NMP while stirring. Next, 43 g of 4,4'-hydroxydiphthalic anhydride was added thereto to react, and a white turbid solution was consequently obtained. Further, the turbid solution was heated to 70° C., and stirred for 3 hours or more, to give a transparent solution of polyamic acid. Next, 16.1 g of 1-ethyl-3,5-diethoxycarbonyl-4-(2-nitrophenyl)-1,4-dihydropyridine and 3.3 g of dimethylaminopyridine were added thereto and dissolved, to give a positive photosensitive resin composition of the present invention.

As for the resulting resin solution, the same procedures as in Example 2 were carried out to determine and the residual film ratio during the development, the residual film ratio during the curing, the resolution, and the storage modulus. The results are shown in Table 1.

TABLE 1

| | Example | | | | | | |
|---|---|---|---|---|---|---|---|
| | 1 | 2 | 3 | 4 | 5 | 6 | 7 |
| Residual Film Ratio During Development (%) | 90 | 83 | 80 | 90 | 88 | 100 | 97 |
| Residual Film Ratio During Curing (%) | 82 | 85 | 85 | 85 | 83 | 85 | 85 |
| Resolution (μm) | 6 | 8 | 8 | 6 | 8 | 8 | 8 |
| Storage Modulus | | | | | | | |
| at 25° C. (GPa) | 0.74 | 0.45 | 0.43 | 0.98 | 0.81 | 0.086 | 0.2 |
| at 250° C. (MPa) | 18 | 19 | 22 | 12 | 19 | 1.1 | 1.1 |

It can be seen from the results of Table 1 that the photosensitive resin compositions obtained in Examples have the properties of low elasticity, high heat resistance, and high resolution.

The positive photosensitive resin composition of the present invention can be utilized in the manufacture of high-density devices.

What is claimed is:

1. A positive photosensitive resin composition comprising:
 (A) a polyamic acid having in its backbone a structural unit represented by the general formula (I):

(I)

wherein $R^1$ is a methyl group or other organic group; and n is an average degree of polymerization and is 2 to 50,
 (B) a 1,4-dihydropyridine derivative represented by the general formula (II):

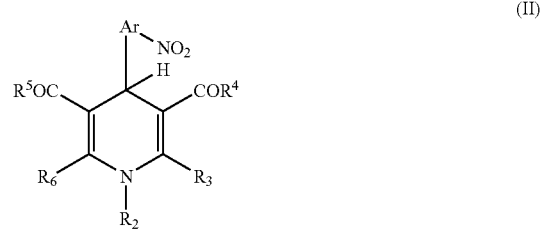

(II)

wherein $R^2$ is a monovalent organic group; each of $R^3$, $R^4$, $R^5$, and $R^6$ is independently hydrogen or a monovalent organic group; and Ar—$NO_2$ is an aromatic hydrocarbon group having a nitro group at ortho-position, and
 (C) an amine compound.

2. The positive photosensitive resin composition according to claim 1, wherein the component (A) is a polyamic acid obtained by reacting a tetracarboxylic dianhydride with a diamino-terminated silicone oligomer represented by the general formula (III):

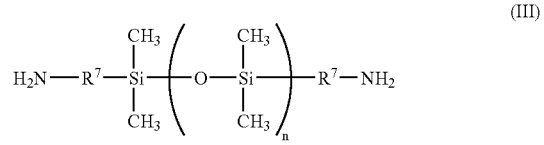

(III)

wherein $R^7$ is an alkylene group; and n represents an average degree of polymerization and is 2 to 50.

3. The positive photosensitive resin composition according to claim 1 or 2, wherein the component (C) is a tertiary amine compound.

4. The positive photosensitive resin composition according to claims 1 or 2, wherein a cured product of the positive photosensitive resin composition has a storage elastic modulus of 1 GPa or less at 25° C., and 1 MPa or more at 250° C.

* * * * *